US007518166B2

United States Patent
Mun et al.

(10) Patent No.: US 7,518,166 B2
(45) Date of Patent: Apr. 14, 2009

(54) TRANSISTOR OR SEMICONDUCTOR DEVICE COMPRISING OHMIC CONTACT IN AN EPITAXY SUBSTRATE

(75) Inventors: Jae Kyoung Mun, Yuseong-gu Daejeon (KR); Jong Won Lim, Daejeon (KR); Woo Jin Chang, Daejeon (KR); Hong Gu Ji, Daejeon (KR); Ho Kyun Ahn, Daejeon (KR); Hae Cheon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 108 days.

(21) Appl. No.: 11/179,971

(22) Filed: Jul. 12, 2005

(65) Prior Publication Data

US 2006/0105510 A1    May 18, 2006
US 2007/0238232 A9    Oct. 11, 2007

(30) Foreign Application Priority Data

Nov. 16, 2004    (KR) .................. 10-2004-0093330

(51) Int. Cl.
*H01L 29/74* (2006.01)

(52) U.S. Cl. .............. 257/194; 257/192; 257/196; 257/200; 257/201; 257/E21.407; 257/195; 257/E21.403; 257/E29.246

(58) Field of Classification Search ............... 257/194, 257/192, E29.246, E21.403, E21.407, 195, 257/196, 200, 201
See application file for complete search history.

(56) References Cited

U.S. PATENT DOCUMENTS 5,038,187 A * 8/1991 Zhou ..................... 257/194

5,262,660 A * 11/1993 Streit et al. .................. 257/194

(Continued)

FOREIGN PATENT DOCUMENTS

JP    2002353411    12/2002
KR    20010035765    5/2001

OTHER PUBLICATIONS

"Low-Insertion-Loss DP3T MMIC Switch for Dual-Band Cellular Phones" Nagayama et al., IEEE Journal of Solid-State Circuits, vol. 34, No. 8, Aug. 1999, pp. 1051-1055.

(Continued)

*Primary Examiner*—Thanh V. Pham
*Assistant Examiner*—Mohammad T Karimy
(74) *Attorney, Agent, or Firm*—Ladas & Parry LLP

(57) ABSTRACT

Provided are a transistor of a semiconductor device and method of fabricating the same. The transistor includes: an epitaxy substrate disposed on a semi-insulating substrate and having a buffer layer, a first Si planar doping layer, a first conductive layer, a second Si planar doping layer, and a second conductive layer, which are sequentially stacked, the second Si planar doping layer having a doping concentration different from that of the first Si planar doping layer; a source electrode and a drain electrode diffusing into the first Si planar doping layer to a predetermined depth and disposed on both sides of the second conductive layer to form an ohmic contact; and a gate electrode disposed on the second conductive layer between the source and drain electrodes and being in contact with the second conductive layer. In this structure, both isolation and switching speed of the transistor can be increased. Also, the maximum voltage limit applied to the transistor is increased due to increases in gate turn-on voltage and threshold voltage and a reduction in parallel conduction element. As a result, the power handling capability of the transistor can be improved, thus improving a high-power low-distortion characteristic and an isolation characteristic.

15 Claims, 3 Drawing Sheets

U.S. PATENT DOCUMENTS

| | | | |
|---|---|---|---|
| 5,872,369 A | 2/1999 | Inokuchi | |
| 6,294,801 B1* | 9/2001 | Inokuchi et al. | 257/192 |
| 6,570,194 B2* | 5/2003 | Kato et al. | 257/194 |
| 6,933,543 B2* | 8/2005 | Mun et al. | 257/194 |
| 2002/0011617 A1* | 1/2002 | Kubo et al. | 257/301 |
| 2004/0104404 A1* | 6/2004 | Bito | 257/192 |

OTHER PUBLICATIONS

"Device Linearity Comparisons Between Doped-Channel and Modulation-Doped Designs in Pseudomorphic $Al_{0.3}Ga_{0.7}As/In_{0.2}Ga_{0.8}As$ Heterostructures" Yang et al., IEEE Transactions on Electron Devices, vol. 43, No. 8 Aug. 1996, pp. 1174-1180.

Akira Nagayama et al, "Low-Insertion-Loss DP3T MMIC Switch for Dual-Band Cellular Phones," IEEE Journal of Solid-State Circuits, vol. 34, No. 8, Aug. 1999, pp. 1051-1055.

Ming-Ta Yang et al, "Device Linearity Comparisons Between Doped-Channel and Modulation-Doped Designs in Pseudomorphic $Al_{0.3}Ga_{0.7}As/In_{0.2}Ga_{0.8}As$ Heterostructures," IEEE Transactions on Electron Devices, vol. 43, No. 8, Aug. 1996, pp. 1174-1180.

* cited by examiner

TRANSISTOR OR SEMICONDUCTOR DEVICE COMPRISING OHMIC CONTACT IN AN EPITAXY SUBSTRATE

CROSS-REFERENCE TO RELATED APPLICATION

This application claims priority to and the benefit of Korean Patent Application No. 2004-93330, filed Nov. 16, 2004, the disclosure of which is incorporated herein by reference in its entirety.

BACKGROUND

1. Field of the Invention

The present invention relates to a compound semiconductor switching device, which is an indispensable device for a compound semiconductor switch microwave monolithic integrated circuit (MMIC), and method of fabricating the same and, more specifically, to a transistor of a semiconductor device and method of fabricating the same, which lead to a reduction in insertion loss and increases in isolation and switching speed and are suitable for designing and fabricating a high-frequency control circuit with a high-power low-distortion characteristic.

2. Discussion of Related Art

In general, mobile communication systems, such as mobile phones or wireless LANs, use GHz-band microwaves for communication and include a switching device for switching high-frequency signals as an antenna switch circuit or a transmitter/receiver switch circuit.

The switching device typically employs a field effect transistor (FET) such as a high electron mobility transistor (HEMT) or a metal-semiconductor field effect transistor (MESFET), which are compound semiconductor transistors, because the FET has a good transmission characteristic, a low operating voltage, a small current, a simple bias circuit, and an easy implementation of multiport and integrated circuit in a high frequency band.

Also, in a high-frequency switch circuit, it is necessary to minimize insertion loss and improve isolation and switching speed. Above all, a radio-frequency control circuit for a cellular terminal or analog terminal significantly needs a high-power switching device with good linearity.

In order to reduce the insertion loss, conventional techniques selected a method of lowering the resistance of a channel region of a transistor used for a switch circuit by designing the channel region such that its doping concentration or width is as increased as possible.

However, as capacitance caused by a Schottky contact formed between a gate electrode and the channel region increases, a high-frequency input signal is leaked from the Schottky contact, thus degrading the isolation of the transistor.

To improve the isolation of the transistor, conventionally, a method of installing a shunt transistor during a circuit designing process was proposed. However, this method causes the chip size to increase, thus resulting in an increase in the cost of production.

Therefore, in order to fabricate a high-power high-frequency control circuit with good power handling capability using a low-power switching device, circuit design techniques, such as an impedance transformation technique, a stacked FETs method, and an inductor-capacitor (LC) resonant circuit technique, or device structure modification techniques, such as a squeezed-gate FET structure, a two kinds of pinch-off voltage FET structure, and a multigate structure, have conventionally been employed.

However, when the circuit design techniques are used, a chip size increases owing to a transmission line for a $\lambda/4$ transformer, a plurality of FETs, and an additional inductor or capacitor adjacent to a switching device, so that the cost of production is on the increase. Further, when the device structure modification techniques are used, the cost of production of chips is raised like in the circuit design techniques because of an additional mask process and an increased distance between a source and a drain.

SUMMARY OF THE INVENTION

The present invention is to provide a transistor of a semiconductor device and method of fabricating the same, in which an epitaxy substrate is structurally optimized such that on-state insertion loss decreases and off-state isolation increases.

Another object of the invention is to provide a semiconductor transistor and method of fabricating the same, in which the transistor is practicable for a high radio-frequency (RF) voltage swing during the operation and a low-voltage operation by improving a gate-drain breakdown voltage characteristic.

Yet another object is to provide a semiconductor transistor and method of fabricating the same, in which even if a high-power high-frequency signal is transmitted, an effective gate voltage as a positive value induced to a gate electrode by RF swing is reduced so as to enhance power and distortion characteristics.

One aspect of the present invention is to provide a transistor of a semiconductor device including: an epitaxy substrate disposed on a semi-insulating substrate and having a buffer layer, a first Si planar doping layer, a first conductive layer, a second Si planar doping layer, and a second conductive layer, which are sequentially stacked, the second Si planar doping layer having a doping concentration different from that of the first Si planar doping layer; a source electrode and a drain electrode diffusing into the first Si planar doping layer to a predetermined depth and disposed on both sides of the second conductive layer to form an ohmic contact; and a gate electrode disposed on the second conductive layer between the source and drain electrodes and being in contact with the second conductive layer.

Another aspect of the present invention is to provide a method of fabricating a transistor of a semiconductor device including steps of: sequentially forming a buffer layer, a first Si planar doping layer, a first conductive layer, a second Si planar doping layer, and a second conductive layer on a semi-insulating substrate, wherein the doping concentration of the second Si planar doping layer is different from that of the first Si planar doping layer; forming a source electrode and a drain electrode by forming a metal thin layer on the second conductive layer, wherein the source and drain electrodes diffuse into the first Si planar doping layer to a predetermined depth to form an ohmic contact; etching a portion of the second conductive layer to a predetermined depth; and forming a gate electrode on the etched second conductive layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

Figure 1:
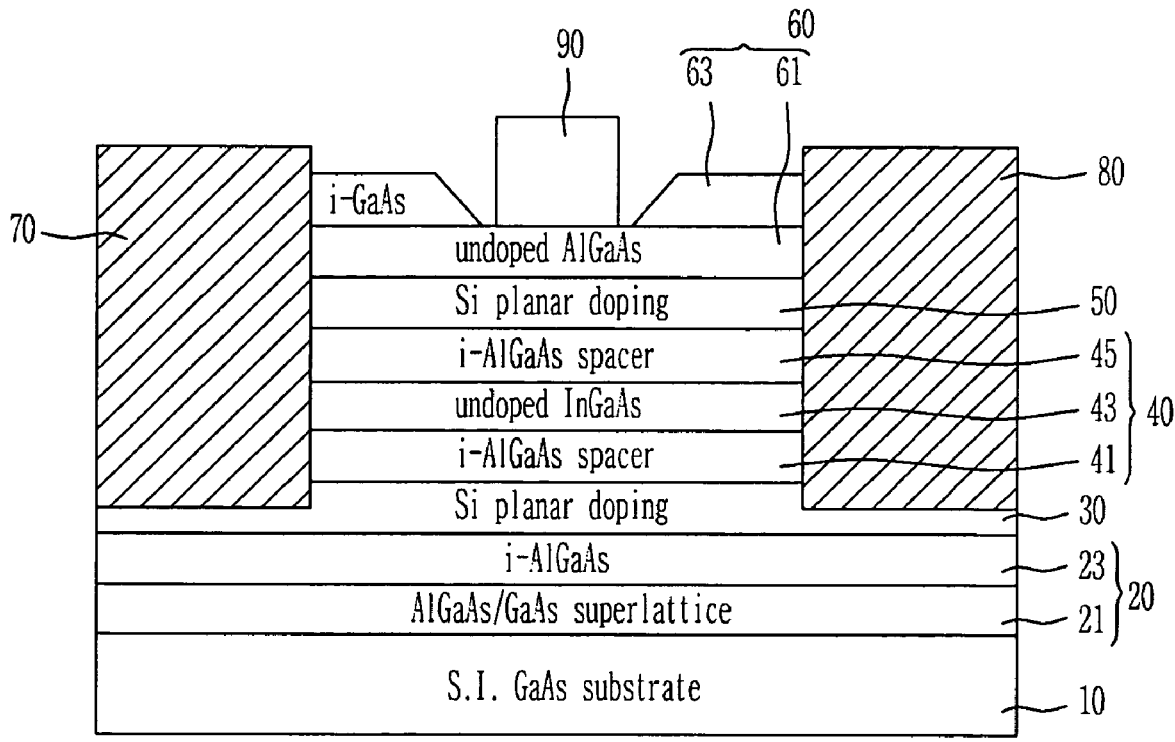
FIG. 1 is a schematic cross-sectional view of a transistor of a semiconductor device according to an exemplary embodiment of the present invention.

FIG. 1 is a schematic cross-sectional view of a transistor of a semiconductor device according to an exemplary embodiment of the present invention. In the transistor of the semiconductor device, an epitaxy substrate is structurally optimized such that the average doping concentration of a channel layer is increased to reduce on-state insertion loss, and the breakdown voltage and turn-on voltage of a gate electrode are increased and the leakage current of the channel layer is reduced to increase off-state isolation.

Referring to FIG. 1, the transistor of the semiconductor device according to the exemplary embodiment of the present invention, i.e., a high-power high-frequency switching device includes an epitaxy substrate disposed on a GaAs semi-insulating substrate 10. The epitaxy substrate includes a buffer layer 20, a first Si planar doping layer 30, a first conductive layer 40, a second Si planar doping layer 50, and a second conductive layer 60, which are sequentially stacked. The doping concentration of the second Si planar doping layer 50 is different from that of the first Si planar doping layer 30.

Further, the switching device includes a source electrode 70, a drain electrode 80, and a gate electrode 90. The source and drain electrodes 70 and 80 diffuse into the first Si planar doping layer 30 to a predetermined depth and are disposed on both sides of the second conductive layer 60 to form an ohmic contact. The gate electrode 90 is disposed on the second conductive layer 60 between the source and drain electrodes 70 and 80 and is in contact with the second conductive layer 60.

In this case, the buffer layer 20 is disposed on the semi-insulating substrate 10 and includes an AlGaAs/GaAs superlattice buffer layer 21, which prevents substrate leakage current during the operation, and an i-AlGaAs buffer layer 23 formed of undoped AlGaAs on the AlGaAs/GaAs superlattice buffer layer 21.

The AlGaAs/GaAs superlattice buffer layer 21 may be obtained by repeating processes forming an AlGaAs layer having a thickness of about 30 to 50 Å and forming a GaAs layer having a thickness of about 30 to 50 Å, 30 to 50 times.

Also, in order to improve the crystallinities of the AlGaAs layers and the carrier confinement of the channel, the composition of Al should be less than Ga, for example, of about 0.3 mol % or less.

The doping concentration of the second Si planar doping layer 50 may be at least 4 times higher than that of the first Si planar doping layer 30. For example, the doping concentration of the first Si planar doping layer 30 may be about $0.5 \times 10^{12}$ to $2.0 \times 10^{12}$ cm$^{-2}$, and the doping concentration of the second Si planar doping layer 50 may be about $2 \times 10^{12}$ to $8 \times 10^{12}$ cm$^{-2}$.

The first conductive layer 40 includes a first i-AlGaAs spacer 41 formed of undoped AlGaAs on the first Si planar doping layer 30, a channel layer 43 formed of undoped InGaAs on the first spacer 41, and a second i-AlGaAs spacer 45 formed of undoped AlGaAs on the channel layer 43.

In this case, the first i-AlGaAs spacer 41 may be formed to a thickness of about 1 to 5 nm, the channel layer 43 may be formed to a thickness of about 10 to 20 nm, and the second i-AlGaAs spacer 45 may be formed to a thickness of about 2 to 10 nm.

Also, the content In should be less than Ga in the undoped InGaAs layer, for example, of about 0.3 mol % or less.

The second conductive layer 60 includes a Schottky contact layer 61 formed of undoped AlGaAs on the second Si planar doping layer 50 and an i-GaAs capping layer 63 formed of undoped GaAs on the Schottky contact layer 61.

Also, each of the Schottky contact layer 61 and the capping layer 63 may be formed to a thickness of about 20 to 50 nm.

In the epitaxy substrate, the source and drain electrodes 70 and 80, which form the ohmic contact, are deeply formed to extend to the first Si doping layer 30 due to thermal annealing for ohmic contact formation. Also, the gate electrode 90, which forms a Schottky contact with the Schottky contact layer 61, is disposed between the source and drain electrodes 70 and 80.

As described above, in the high-frequency switching device according to the exemplary embodiment of the present invention, in order to reduce the on-state insertion loss, the concentration of Si in each of the first and second Si planar doping layer 30 and 50 can be increased, and the ohmic contact between the source and drain electrodes 70 and 80 can be formed to a great depth to reduce contact resistance therebetween.

Meanwhile, in order to reduce a substrate leakage current in the off-state switching device and increase the switching speed of a switch circuit, the concentration of the Si planar doping layers should be controlled considering the fact that the intensity of an electric field in the channel layer 43 in a vertical direction is gradually weakened under the gate electrode 90 in the off state.

Accordingly, the doping concentration of the first Si planar doping layer 30 disposed to a relatively great depth from the Schottky contact surface should be lower than that of the second Si planar doping layer 50 disposed to a relatively small depth. In this case, a depletion region of the channel layer 43 can expand toward the AlGaAs/GaAs superlattice layer 21 at higher speed with respect to the same gate voltage, so that the switching speed increases and also substrate leakage current decreases. Hence, the isolation of the switch circuit can be enhanced.

In addition, the concentration ratio of the second Si planar doping layer 50 to the first Si planar doping layer 30 is calculated based on the expansion gradient of the depletion region of the channel layer 43 caused by the electric field of the gate electrode 90. As a result, the doping concentration of the second Si planar doping layer 50 should be at least 4 times as high as that of the first Si planar doping layer 30, and the average concentration of the first and second Si planar doping layer 30 and 50 is determined considering a reduction in on-state insertion loss.

To obtain an optimized structure, the epitaxy substrate includes the Schottky contact layer 61 formed of undoped AlGaAs and the capping layer 63 formed of undoped GaAs, thus enhancing a gate breakdown voltage characteristic and a turn-on voltage characteristic. When a high-power high-frequency signal is transmitted, the high turn-on voltage characteristics increase resistance to an effective voltage induced to the gate electrode 90 by voltage swing, with the result that both a power characteristic and a distortion characteristic are enhanced.

The gate electrode 90 is formed on the Schottky contact layer 61 formed of undoped AlGaAs after the i-GaAs capping layer 63 is etched.

The Schottky contact layer 61 formed of undoped AlGaAs improves a gate-drain breakdown voltage and a gate turn-on voltage and thus, improves the linearity of the switch circuit and reduces parallel conduction.

For the input and output characteristics of the switching device, the gate electrode 90 may be disposed halfway between the source and drain electrodes 70 and 80. That is, a distance between the gate and source electrodes 90 and 70 may be equal to a distance between the gate and drain electrodes 90 and 80.

In the high-frequency switching device having the above-described structure, the epitaxy substrate having a double planar doping structure (i.e., the first and second Si planar doping layers 30 and 50) is designed such that the doping concentration of the second Si planar doping layer 50 is higher than that of the first Si planar doping layer 30, preferably, at least 4 times as high as that of the first Si planar doping layer 30.

Accordingly, the diffusion speed of the depletion region is controlled by using the intensity of an electric field of the gate electrode 90 relative to the channel depth. Thus, both the isolation and switching speed of the switching device can be enhanced due to a reduction in the substrate leakage current.

In conventional methods, a switching device is typically fabricated using a heavily doped capping layer in order to lower ohmic contact resistance. However, since this structure causes surface leakage current between gate-source or gate-drain, an additional process, such as a wide recess process, should be performed to make up for the surface leakage current.

On the other hand, in the present invention, even if the i-GaAs capping layer 63 is used, the source and drain electrodes 70 and 80 having low contact resistance can be formed using an optimized rapid thermal anneal (RTA) process, and the source-gate and gate-drain breakdown voltages and turn-on voltage can be increased. As a result, the power characteristic of the switching device can be enhanced.

The excellent structural characteristics of the switching device according to the present invention stand out especially when the switching device is turned off. Typically, the isolation of a switch circuit using a field effect transistor (FET) is deteriorated with an increase in voltage (or a reduction in operating voltage) applied to a gate electrode in an off-state. This is because a gate effective control voltage applied to the gate electrode increases positively.

Hereinafter, a method of fabricating the above-described transistor of the semiconductor device according to the exemplary embodiment of the present invention will be described.

Referring to FIG. 1, a buffer layer 20, a first Si planar doping layer 30, a first conductive layer 40, a second Si planar doping layer 50, a second conductive layer 60 are sequentially stacked on a GaAs semi-insulating substrate 10. The buffer layer 20 includes an AlGaAs/GaAs superlattice buffer layer 21 and an i-AlGaAs buffer layer 23 formed of undoped AlGaAs. The first conductive layer 40 includes a first spacer 41 formed of undoped AlGaAs, a channel layer 43 formed of undoped InGaAs, and an i-AlGaAs second spacer 45 formed of undoped AlGaAs. The second conductive layer 60 includes a Schottky contact layer 61 formed of undoped AlGaAs and an i-GaAs capping layer 63 formed of undoped GaAs. The doping concentration of the second Si planar doping layer 50 is different from that of the first Si planar doping layer 30.

In this case, the first and second Si planar doping layers 30 and 50 may be formed by doping Si impurities using a planar doping process and have a doping concentration of about $0.5 \times 10^{12}$ to $2.0 \times 10^{12}$ cm$^{-2}$ and about $2 \times 10^{12}$ to $8 \times 10^{12}$ cm$^{-2}$, respectively.

Thereafter, a metal thin layer, for example, an AuGe/Ni/Au layer, is formed on the i-GaAs capping layer 63 and annealed using an RTA process, thereby forming a source electrode 70 and a drain electrode 80 to form an ohmic contact.

Meanwhile, in conventional methods, a switching device is typically formed using a heavily doped capping layer to drop ohmic contact resistance. However, in the present invention, an annealing process is performed according to an optimized annealing time-temperature profile. Thus, while the metal thin layer is being alloyed with a semiconductor substrate, it diffuses into the first Si planar doping layer 30. As a result, unlike in the conventional methods, even if the i-GaAs capping layer 63 is disposed, the source and drain electrodes 70 and 80 having low ohmic contact resistance can be formed and a breakdown voltage can be elevated, thus improving power characteristics.

After the ohmic contact is formed, an image reversal pattern (not shown) is formed on the i-GaAs capping layer 63 using, for example, a photoresist, and then the i-GaAs capping layer 63 is etched using a gate recess process such that a portion of the Schottky contact layer 61 is exposed.

Thereafter, a surface oxide of about 5 nm thickness is removed from the exposed portion of the Schottky contact layer 61 formed of undoped AlGaAs to improve a Schottky contact characteristic, and a Ti/Pt/Au material for a gate electrode is deposited thereon.

In general, when a switch circuit operates, if gate leakage current exists, the effective control voltage of a gate is reduced. Thus, an on-voltage and an off-voltage are switched for the entire RF full cycle in the high power level so that the switch circuit exhibits a nonlinear characteristic and cannot effectively function as a switch. As a result, it is required to elevate the operating voltage of the switch circuit. However, because the present invention improves the leakage current characteristic of the gate electrode and increases the turn-on voltage and the breakdown voltage of the gate electrode, the above-described problem can be solved and a high-power high-frequency switching device with good linearity can be fabricated.

After the Ti/Pt/Au material is deposited, a gate electrode 90 is formed between the source and drain electrodes 70 and 80 using a lift-off process. For the input and output characteristics of the switching device, a distance between the gate and source electrodes 90 and 70 may be equal to a distance between the gate and drain electrodes 90 and 80.

The present invention will now be described in more detail with reference to the following unlimited experimental examples. Meanwhile, a description that can be technically analogized by those skilled in the art will not be presented here.

EXPERIMENTAL EXAMPLE 1

Figure 2A:
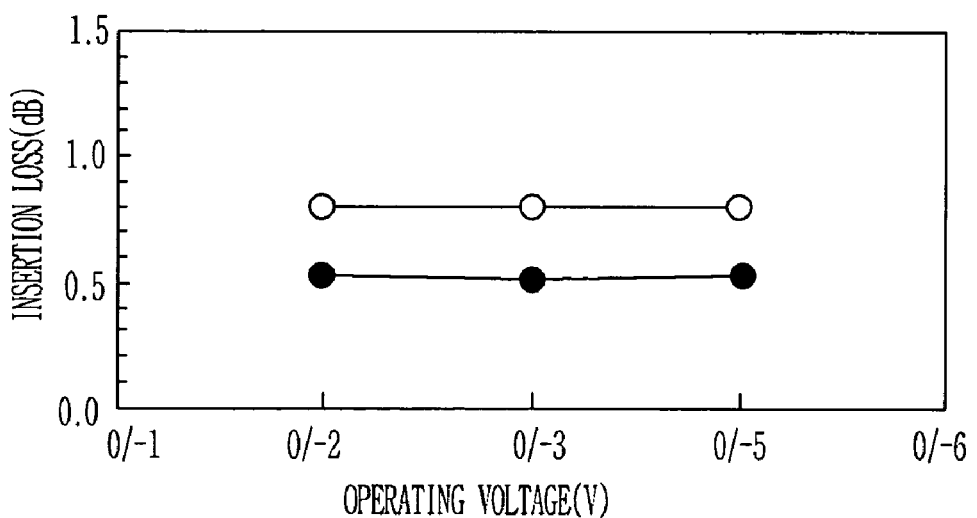
FIG. 2A is a graph of insertion loss versus operating voltage in single-pole-double-throw (SPDT) circuits that include a conventional transistor of a semiconductor device and a transistor of a semiconductor device according to the present invention, respectively.
Figure 2B:
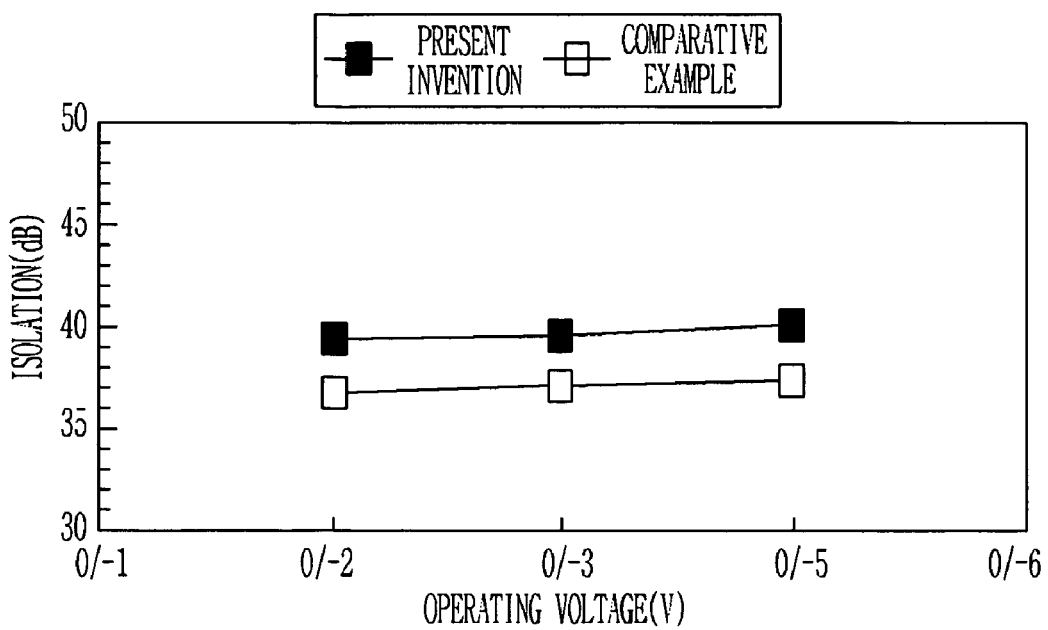
FIG. 2B is a graph of isolation versus operating voltage in SPDT circuits that include a conventional transistor of a semiconductor device and a transistor of a semiconductor device according to the present invention, respectively.

FIG. 2A is a graph of insertion loss versus operating voltage in single-pole-double-throw (SPDT) circuits that include a conventional transistor of a semiconductor device and the transistor of the semiconductor device according to the present invention, respectively, and FIG. 2B is a graph of isolation versus operating voltage in the SPDT circuits that include the conventional transistor of the semiconductor device and the transistor of the semiconductor device according to the present invention, respectively. In experimental example 1, an SPDT switch microwave monolithic integrated circuit (MMIC) was fabricated as the transistor of the semiconductor device according to the present invention (i.e., as a switching device), and the insertion loss and the isolation based on the on- and off-state operating voltages applied to the gate electrode 90 in an operating frequency of 2.4 GHz were measured.

A switching device according to a comparative example had a similar structure to that of the switching device shown in FIG. 1, except that the doping concentration of the second Si planar doping layer 50 was lower than or equal to that of the first Si planar doping layer 30. On the other hand, the switching device according to the present invention was fabricated such that the doping concentration of the second Si planar doping layer 50 was at least 4 times as high as that of the first Si planar doping layer 30.

In order to compare the excellence of the present invention, the pinch-off voltages of the two switching devices were controlled to be the same using a gate recess process, and a variation in transconductance based on the gate voltage, which are closely associated with switching speed or isolation, was appreciated among the direct current (DC) characteristics of the switching devices.

When the two switching devices have the same pinch-off voltage, the value of a gate voltage required for conversion from a saturated transconductance state to a pinch-off state is an index of the speed at which each of the turned-on switching devices is turned off. As the required gate voltage is lower, the slope of the transconductance curve becomes steeper, the switching speed of the switching device grows faster, and the off-state isolation becomes better.

The variation in transconductance of the comparative example was about 210 mS/mm.V, whereas that of the present invention was about 500 mS/mm.V, which greatly improved more than 2 times.

In FIG. 2A, black circle (●) refers to insertion loss relative to operating voltage in the high-frequency switch circuit according to the present invention, and white circle (○) refers to insertion loss relative to operating voltage in the comparative example. In FIG. 2B, black square (■) refers to isolation relative to operating voltage in the switch circuit according to the present invention, and white square (□) refers to isolation relative to operating voltage in the comparative example. The insertion loss of the switch circuit according to the present invention was reduced to about 0.3 dB lower than that of the comparative example, and the isolation of the switch circuit according to the present invention was increased to about 3 dB higher than that of the comparative example. In particular, while the operating voltage decreased from 0/−5 to 0/−2 V, the insertion loss was held constant and the isolation was deteriorated to a small extent of about 0.5 dB.

From the above result, it can be concluded that the structure of the switching device according to the present invention leads to a reduction of leakage current element, and increases in the breakdown voltage and turn-on voltage of the gate electrode 90 formed on the Schottky contact layer 61 formed of undoped AlGaAs result in a enhancement of the effective voltage applied to the gate electrode 90. As a consequence, the switching device can perform low-voltage operations. In other words, according to the present invention, a switch circuit having excellent power characteristic and distortion characteristic can be embodied.

EXPERIMENTAL EXAMPLE 2

Figure 3A:
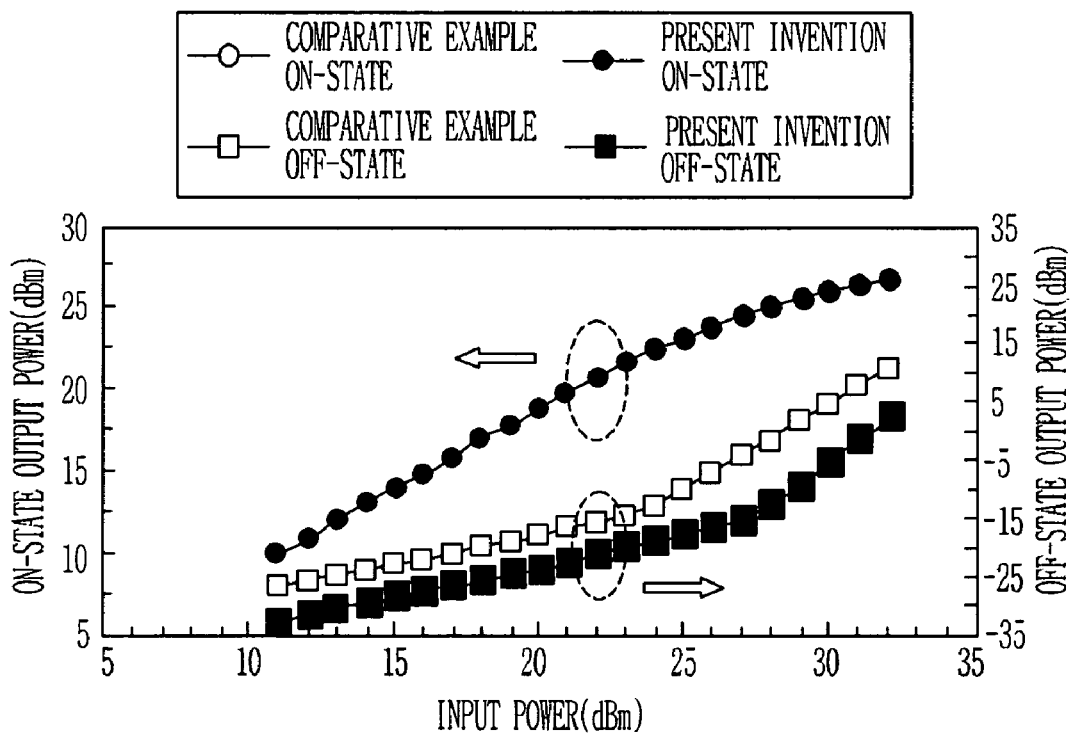
FIG. 3A is a graph of on-state output power and off-state output power versus input power in SPDT circuits that include a conventional transistor of a semiconductor device and a transistor of a semiconductor device according to the present invention, respectively.
Figure 3B:
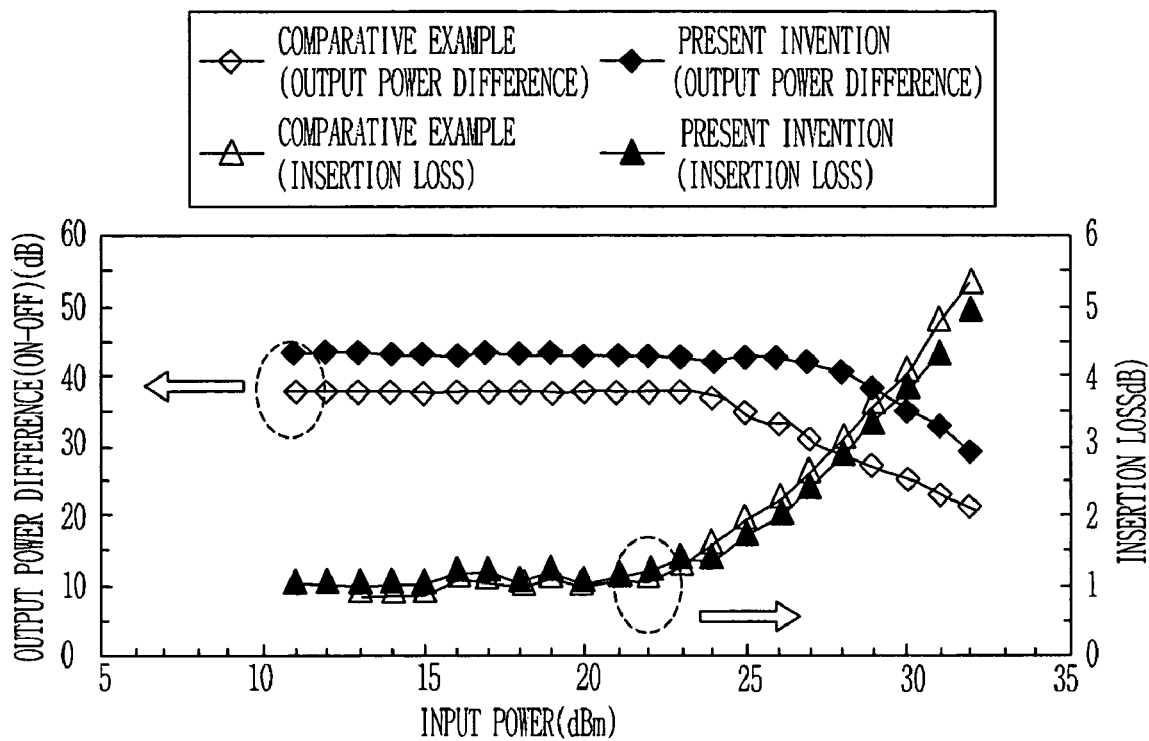
FIG. 3B is a graph of output power difference (i.e., isolation) and insertion loss versus input power in SPDT circuits that include a conventional transistor of a semiconductor device and a transistor of a semiconductor device according to the present invention, respectively.

FIG. 3A is a graph of on-state output power and off-state output power versus input power in the SPDT circuits that include the conventional transistor of the semiconductor device and the transistor of the semiconductor device according to the present invention, respectively, and FIG. 3B is a graph of output power difference (i.e., isolation) and insertion loss versus input power in the SPDT circuits that include the conventional transistor of the semiconductor device and the transistor of the semiconductor device according to the present invention, respectively. FIGS. 3A and 3B illustrate the power characteristics of the switch circuits according to the present invention and comparative example.

When the pinch-off voltages of switching devices of the two switch circuits were the same (i.e., −1.0 V), the power characteristics of the SPDT switch circuits that were fabricated using the switching devices according to the comparative example and the present invention like in the experimental example 1 were measured at an operating frequency of 2.4 GHz. In this case, the total gate widths of the two switching devices were the same.

In FIG. 3A, black circle (●) and black square (■) refer to on-state output power and off-state output power relative to input power in the switch circuit according to the present invention, respectively. Also, white circle (○) and white square (□) refer to on-state output power and off-state output power relative to input power in the comparative example, respectively.

In FIG. 3B, black lozenge (♦) and black triangle (▲) refer to a difference between on-state output power and off-state output power and a difference between on-state output power and input power in the switch circuit according to the present invention, respectively. Also, white lozenge (◊) and white triangle (△) refer to a difference between on-state output power and off-state output power and a difference between on-state output power and input power in the comparative example, respectively.

Accordingly, the difference between the on-state output power and the off-state output power corresponds to isolation between double throws in the SPDT circuit, and the difference between the on-state output power and the input power corresponds to the insertion loss of an RF signal.

When the switch circuit is turned on, the power handling capability of the switch circuit depends on the maximum current limit of the switching device, on the other hand, when the switch circuit is turned off, the power handling capability of the switch circuit depends on the maximum voltage limit of the switching device.

However, the power handling capability of the switch circuit is limited substantially because of degradation of off-state isolation rather than the loss of an on-state RF signal. For this reason, the power handling capability of the switch circuit is typically defined as an input power value at which the degradation of off-state isolation is 1 dB.

As shown in FIG. 3A, in the high frequency band of 2.4 GHz, the isolation and power handling capability of the switching device according to the present invention were increased to about 6 dB and 4 dB more than those of the comparative example, respectively. Nevertheless, referring to FIG. 3B, the insertion loss made little difference.

EXPERIMENTAL EXAMPLE 3

In a switching device used for a system such as a portable communication terminal, which needs low-voltage operations, low distortion is a very important requirement for chips. The distortion characteristic of the chips can be evaluated by measuring $3^{rd}$ order intercept point (IP3), which is an index of linearity.

Figure 4:
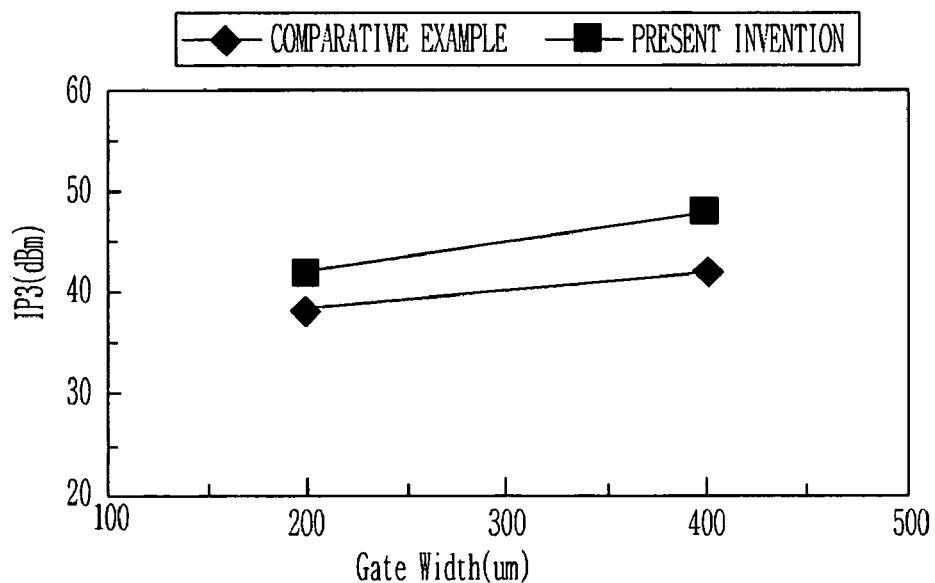
FIG. 4 is a graph of $3^{rd}$ order intercept point (IP3) versus gate width in SPDT circuits that include a conventional transistor of a semiconductor device and a transistor of a semiconductor device according to the present invention, respectively.

FIG. 4 is a graph of IP3 versus gate width in the SPDT circuits that include the conventional transistor of the semiconductor device and the transistor of the semiconductor device according to the present invention, respectively. In FIG. 4, black square (■) and black lozenge (♦) correspond to the switch circuits according to the present invention and the comparative example, respectively.

Like in the foregoing experimental example 1, switching devices according to the present invention and comparative example were prepared, and the SPDT circuits were fabricated using the same, respectively. Then, the IP3 characteristic of the SPDT circuits was appreciated as the index of distortion or linearity. In this case, the gate widths of the switching devices used for the two switch circuits were the same, i.e., 200 and 400 microns.

As shown in FIG. 4, the IP3 characteristic of the switching device according to the present invention was increased to about 4 dB more than that of the comparative example at the gate width of 200 microns and increased to about 6 dB more than that of the comparative example at the gate width of 400 microns. From this result, it can be concluded that a channel structure of the switching device according to the present invention is more suitable for designing and fabricating a high-power switch circuit with good linearity.

The improvement of the IP3 characteristic results from the concentration ratio of the first Si planar doping layer 30 to the second Si planar doping layer 50 and the thicknesses of the first and second spacers 41 and 45, which are adjusted to appropriately control the diffusion speed of the depletion region relative to the intensity of an electric field in a Schottky gate formed on the i-AlGaAs buffer layer 23. Also, the IP3 is improved in the present invention because the channel layer 43 is pinched off (i.e., the switching device according to the present invention is turned off) when the slope of the transconductance relative to the gate voltage of the switching device is at least 2 times as steep as that of the transconductance relative to the gate voltage of a conventional switching device.

As described above, according to the present invention, a switching device is obtained from an optimized epitaxy substrate having a double planar doping structure and thus, has a lot of advantages. Specifically, both isolation and switching speed are increased by controlling the diffusion speed of a depletion region relative to the channel depth, which is proportional to a variation in the slope of transconductance. Also, since a Schottky gate contact is formed on an undoped AlGaAs buffer layer, the maximum voltage limit applied to the switching device is increased due to increases in gate turn-on voltage and breakdown voltage and a reduction in parallel conduction element. As a result, the power handling capability of the switching device is enhanced, thus improving a high-power low-distortion characteristic and an isolation characteristic.

Further, when a switch MMIC is designed using the switching device according to the present invention, any additional shunt FET is not required to improve isolation, and any additional transmission line for a λ/4 transformer, inductor, or capacitor is not needed adjacent to the switching device to enhance power handling capability. Hence, a chip size can be scaled down, and highly integrated switch circuits can be fabricated with increased yield. As a consequence, the cost of production can be greatly reduced.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. A transistor of a semiconductor device, comprising:
   an epitaxy substrate disposed on a semi-insulating substrate and having a buffer layer, a first Si planar doping layer, a first conductive layer including a channel layer, a second Si planar doping layer, and a second conductive layer, which are sequentially stacked, the second Si planar doping layer having a doping concentration different from that of the first Si planar doping layer;
   a source electrode and a drain electrode comprising a metal thin layer diffused into a predetermined depth of the epitaxy substrate including the second conductive layer, the second Si planar doping layer, the first conductive layer and the first Si planar doping layer, the source and drain electrodes being disposed on both sides of the second conductive layer to form an ohmic contact, wherein the predetermined depth extends through a portion of the first Si planar doping layer but does not pass through the entire first Si planar doping layer, such that the source and drain electrodes are formed on the first Si planar doping layer; and
   a gate electrode disposed on the second conductive layer between the source and drain electrodes and being in contact with the second conductive layer.

2. The transistor according to claim 1, wherein the buffer layer includes:
   a superlattice buffer layer comprising AlGaAs and GaAs, wherein the superlattice buffer layer is disposed on the semi-insulating substrate and prevents substrate leakage current during the operation; and
   an AlGaAs buffer layer disposed on the superlattice buffer layer and formed of undoped AlGaAs.

3. The transistor according to claim 2, wherein the superlattice buffer layer comprises 30 to 50 AlGaAs layers and 30 to 50 GaAs layers, and wherein each AlGaAs layer is 30 to 50 Å and each GaAs layer is 30 to 50 Å, and the AlGaAs and GaAs layers alternate.

4. The transistor according to claim 3, wherein the AlGaAs layer of the superlattice buffer layer has an Al content less than a Ga content and contains Al of about 0.3 mol % or less.

5. The transistor according to claim 1,
wherein the first Si planar doping layer is below the first conductive layer and separated from the channel layer, and the second Si planar doping layer is above the conductive layer and separated from the channel layer, and the doping concentration of the second Si planar doping layer is higher than that of the first Si planar doping layer to increase the speed a depletion region of the channel layer expands towards the buffer layer.

6. The transistor according to claim 5, wherein the doping concentration of the second Si planar doping layer is at least 4 times as high as that of the first Si planar doping layer.

7. The transistor according to claim 1, wherein the first conductive layer includes:
a first spacer disposed on the first Si planar doping layer and formed of undoped AlGaAs;
the channel layer disposed on the first spacer and formed of undoped InGaAs; and
a second spacer disposed on the channel layer and formed of undoped AlGaAs.

8. The transistor according to claim 7, wherein the first spacer has a thickness of about 1 to 5 nm, the channel layer has a thickness of about 10 to 20 nm, and the second spacer has a thickness of about 2 to 10 nm.

9. The transistor according to claim 7, wherein each of the first and second spacers formed of AlGaAs has an Al content less than a Ga content and contains Al of about 0.3 mol % or less.

10. The transistor according to claim 7, wherein the channel layer has an In content less than a Ga content and contains In of about 0.25 mol % or less.

11. The transistor according to claim 1, wherein the second conductive layer includes:
a Schottky contact layer disposed on the second Si planar doping layer and formed of undoped AlGaAs; and
a capping layer selectively disposed on the Schottky contact layer between the source and drain electrodes, wherein the capping layer is formed of undoped GaAs, and wherein the capping layer is selectively disposed such that a portion of the undoped AlGaAs layer is exposed,
wherein the gate electrode is disposed on the exposed portion of the Schottky contact layer between the capping layer.

12. The transistor according to claim 11, wherein the Schottky contact layer formed of AlGaAs has an Al content less than a Ga content and contains Al of about 0.3 mol % or less.

13. The transistor according to claim 11, wherein each of the Schottky contact layer and the capping layer has a thickness of 20 to 50 nm.

14. The transistor according to claim 1, wherein a distance between the gate electrode and the source electrode is equal to a distance between the gate electrode and the drain electrode.

15. The transistor according to claim 1, wherein the doping concentration of the first Si planar doping layer is about $0.5 \times 10^{12}$ to $2.0 \times 10^{12}$ cm$^{-2}$, and the doping concentration of the second Si planar doping layer is about $2 \times 10^{12}$ to $8 \times 10^{12}$ cm$^{-2}$.

* * * * *